United States Patent
Cloutier et al.

[11] Patent Number: 5,114,744
[45] Date of Patent: May 19, 1992

[54] METHOD FOR APPLYING A CONDUCTIVE TRACE PATTERN TO A SUBSTRATE

[75] Inventors: Frank L. Cloutier, Singapore; Ching K. Chieng, Bukit Merah Central; Siow W. Min, Singapore, all of Singapore

[73] Assignee: Hewlett-Packard Company, Palo Alto, Calif.

[21] Appl. No.: 614,067

[22] Filed: Nov. 7, 1990

Related U.S. Application Data

[63] Continuation of Ser. No. 397,145, Aug. 21, 1989, abandoned.

[51] Int. Cl.⁵ ............................................. C23C 26/00
[52] U.S. Cl. ........................................ 427/96; 427/191;
     427/197; 427/207.1; 427/376.7; 346/75
[58] Field of Search .............. 427/96, 191, 197, 207.1,
     427/376.7; 346/75

[56] References Cited

U.S. PATENT DOCUMENTS

| | | | |
|---|---|---|---|
| 3,519,512 | 7/1970 | Downs . | |
| 4,234,626 | 11/1980 | Peiffer | 427/96 |
| 4,327,124 | 4/1982 | Des Marais | 427/96 |
| 4,352,691 | 10/1982 | Owatari | 106/20 |
| 4,411,980 | 10/1983 | Haney | 430/330 |
| 4,490,728 | 12/1984 | Vaught et al. . | |
| 4,500,895 | 2/1985 | Buck et al. . | |
| 4,521,789 | 6/1985 | Jinnai | 346/75 |
| 4,668,533 | 5/1987 | Miller . | |
| 4,677,447 | 6/1987 | Nielsen . | |
| 4,717,639 | 1/1988 | Dubin | 427/96 |
| 4,790,880 | 12/1988 | Miller | 106/20 |
| 4,791,438 | 12/1988 | Hanson et al. . | |
| 4,794,409 | 12/1988 | Cowger et al. . | |
| 4,834,799 | 5/1989 | Song | 106/20 |
| 4,840,674 | 6/1989 | Schwarz | 106/20 |
| 4,853,252 | 8/1989 | Frankel | 427/126.5 |
| 4,972,204 | 11/1990 | Sexton | 346/75 |

FOREIGN PATENT DOCUMENTS

| | | | |
|---|---|---|---|
| 3047884 | 7/1982 | Fed. Rep. of Germany | 427/96 |
| 3107079 | 9/1982 | Fed. Rep. of Germany | 427/123 |

OTHER PUBLICATIONS

Robert H. Perry ed. "Perry's Chemical Engineers' Handbook" 6th ed. McGraw-Hill, 1984 pp. 8—8.
Hewlett-Packard Journal, May 1985, vol. 36, No. 5.

*Primary Examiner*—Michael Lusignan
*Assistant Examiner*—Vi Duong Dang

[57] ABSTRACT

A fabrication method for applying electrically conductive circuit traces to a substrate is described. The method uses an ink composition which is applied to a selected substrate by an ink delivery system. The ink includes an adhesive in combination with other additives, including one or more sovlents. The ink is delivered by the ink jet system in a selected pattern, followed by the application of a powdered metal to the pattern which adheres to the adhesive in the ink. After the removal of excess powder, the substrate, pattern and powder are heated in an amount sufficient to melt the powder on the substrate. This produces a pattern of conductive traces geometrically corresponding to the ink pattern initially applied to the substrate.

6 Claims, 1 Drawing Sheet

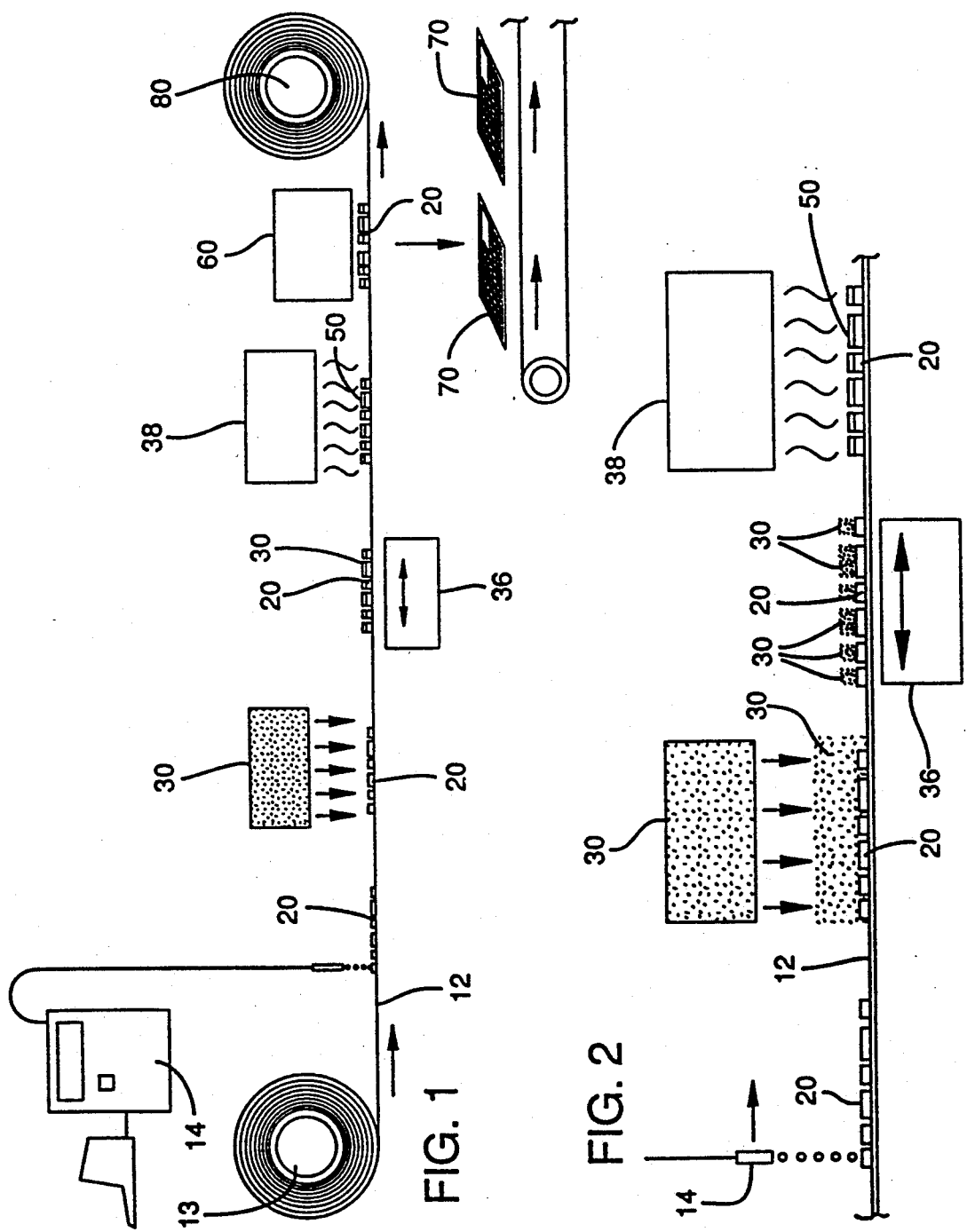

METHOD FOR APPLYING A CONDUCTIVE TRACE PATTERN TO A SUBSTRATE

CROSS REFERENCE TO RELATED APPLICATION

This application is a continuation, of application Ser. No. 07/397,145, filed Aug. 21, 1989, now abandoned.

BACKGROUND OF THE INVENTION

The present invention generally relates to the formation of electrical traces on a substrate, and more particularly to the formation of electrical traces using an ink jet system to apply a circuit pattern, followed by the application of a powdered metal composition which is melted to produce the traces.

The development of increasingly sophisticated computer and electronic systems has created a corresponding need for circuit production methods of improved efficiency and economy. In order to achieve these goals, many circuit fabrication methods have been developed and used. For example, U.S. Pat. No. 4,668,533 to Miller involves a printed circuit production method which uses an ink containing a conductive metal or metal-containing activator. In a preferred embodiment, the ink is delivered using an ink jet system, followed by the application of a secondary metal layer using an electroless metal plating solution. Other methods of circuit fabrication involve the use of screen printing techniques which are well known in the art.

However, a need remains for an improved method of manufacturing conductive circuit traces in a rapid and efficient manner with a minimal number of process steps. The present invention satisfies this need, as described herein below.

SUMMARY OF THE INVENTION

It is an object of the present invention to provide a circuit fabrication method which is capable of producing conductive traces on a substrate in an efficient and rapid manner.

It is another object of the invention to provide a circuit fabrication method which uses a minimal number of process steps.

It is another object of the invention to provide a circuit fabrication method which is readily adaptable to large-scale, mass production manufacturing conditions.

It is a further object of the invention to provide a circuit fabrication method which is usable with a wide variety of substrates.

It is a still further object of the invention to provide a circuit fabrication method which uses readily available, economical materials.

It is an even further object of the invention to provide a circuit fabrication method which uses ink jet technology to deliver an ink pattern to a substrate, followed by the application of a powdered metal composition thereto which is subsequently melted.

In accordance with the foregoing objects, a fabrication method for efficiently applying electrically conductive circuit traces to a substrate is disclosed. The method uses an ink composition which is applied to a selected substrate by an ink jet delivery system. The ink contains an adhesive in combination with other additives, including one or more solvents. The ratios and proportions of these ingredients may be experimentally varied, depending on the substrate to which the ink is applied, and other extrinsic factors. Preferred substrates comprise thermoplastic materials including but not limited to ABS (acrylonitrile-butadiene-styrene), PVC (polyvinyl chloride), and PC (polycarbonate) as well as polyester film. The ink is delivered by the ink jet system in a selected pattern, followed by the application of a powdered metal composition to the pattern which adheres to the adhesive in the ink. After the removal of excess powdered metal, the substrate is heated in an amount sufficient to melt the powder on the substrate. This procedure produces a pattern of conductive traces substantially identical to the ink pattern initially applied to the substrate.

These and other objects, features, and advantages of the invention will become apparent from the following Detailed Description of a Preferred Embodiment and Drawings.

BRIEF DESCRIPTION OF THE DRAWINGS

FIG. 1 is a schematic representation to the process steps, materials, and components used to produce conductive traces on a substrate in accordance with the invention.

FIG. 2 is an enlarged schematic representation showing the formation of a conductive trace pattern on a substrate using an adhesive-based ink and powdered metal composition.

DETAILED DESCRIPTION OF A PREFERRED EMBODIMENT

The present invention involves an improved method for producing conductive circuit traces in a highly efficient and economical manner. In accordance with the invention, an ink composition is first used to form a selected circuit pattern on a substrate. With reference to FIG. 1, a substrate 12 is illustrated. A wide variety of substrates known in the art may be used, including thin-film polyester, ABS (acrylonitrile-butadiene-styrene) plastic, PC (polycarbonate) plastic, PVC (polyvinyl chloride) plastic, and PC/ABS (50:50) blends. Other substrates may be used, and the invention shall not be limited to those listed above.

To implement the present invention on a massproduction scale, it is desirable to dispense the substrate 12 from a roll 13 (FIG. 1.), although the substrate 12 may be in the form of a single flat sheet if desired. As the substrate 12 is delivered from the roll 13, it moves toward and through a computer controllable ink jet printing apparatus 14 known in the art. In a preferred embodiment, a thermal ink jet printing system is used. Typical thermal ink jet systems include an ink reservoir in fluid communication with an orifice plate and resistor assembly. These types of systems are known in the art, and described in the *Hewlett-Packard Journal*, May 1985, Vol. 36, No. 5. In addition, exemplary ink jet systems with which the invention may be used are illustrated in U.S. Pat. Nos. 4,500,895; 4,794,409; 4,791,438; 4,677,447; and 4,490,728. However, the invention shall not be limited to any particular type of ink jet system, and may be implemented using a wide variety of systems known in the art, including those listed above.

The ink jet printing apparatus 14 is designed to dispense ink in a selected circuit pattern 20 on the substrate 12 (FIGS. 1 and 2.) The geometry of the circuit pattern 20 may be varied as desired, depending on the ultimate use for which the circuit is intended. In a preferred embodiment, the pattern 20 will have a thickness of about 0.5–2.0 mil (1.0 mil = preferred).

The printing apparatus 14 is supplied with a specially formulated ink composition designed to adhere to the substrate 12 in a rapid and secure manner. In accordance with the invention, the composition includes about 5-40% by weight adhesive (30% by weight =preferred), and about 60-95% by weight solvent (70% by weight =preferred.) A preferred adhesive usable in the invention is a product manufactured by the Loctite Corporation of Cleveland, OH under the name "Loctite 408." This material consists of a cyanoacrylate-based compound. Another adhesive which may be used is manufactured by Emhart Australia Pty. Ltd. of Victoria, Australia under the name "Bostik Super Bond." However, the present invention shall not be limited to the specific adhesives described above, and other adhesives known in the art may be used accordingly. These adhesives should be non-toxic, non-flammable, have a viscosity of about 5-100 cps, and a surface tension of about 20-60 dynes/cm.

As previously indicated, the adhesive is combined with one or more solvents. Exemplary solvents include ethylene glycol phenyl ether, gamma-butyrolactone, methyl ethyl ketone, water, and mixtures thereof. Other solvents known in the art may be used, and the invention shall not be limited to the solvents listed above. In addition, the solvents may be mixed in a variety of experimentally determined combinations, depending on the substrate/adhesive involved, as well as type of ink jet delivery system being used.

A variety of specific ink compositions produced in accordance with the invention are described below in the following Examples:

EXAMPLE 1

| COMPONENT | WT % |
| --- | --- |
| Loctite 408 (adhesive) | 30 |
| gamma butyrolactone (solvent) | 50 |
| methyl ethyl ketone (solvent) | 10 |
| ethylene glycol phenyl ether (solvent) | 5 |
| water (solvent) | 5 |
|  | 100% |

EXAMPLE 2

| COMPONENT | WT % |
| --- | --- |
| Bostik Super Bond (adhesive) | 30 |
| gamma butyrolactone (solvent) | 50 |
| methyl ethyl ketone (solvent) | 10 |
| ethylene glycol phenyl ether (solvent) | 5 |
| water (solvent) | 5 |
|  | 100% |

EXAMPLE 3

| COMPONENT | WT % |
| --- | --- |
| Loctite 408 (adhesive) | 40 |
| gamma butyrolactone (solvent) | 50 |
| methyl ethyl ketone (solvent) | 5 |
| water (solvent) | 5 |
|  | 100% |

In a preferred embodiment, the ink composition will have a viscosity of about 5-25 cps (10 cps =optimum), and a surface tension of about 30-60 dynes/cm (50 dynes/cm=optimum.)

After application o the pattern 20 to the substrate 12, a powdered metal composition 30 having a preferred average particle size diameter of 30-50 microns (40 microns=optimum) is applied to the pattern 20 (FIGS. 1 and 2). In a preferred embodiment, the powdered metal composition 30 consists of a lead/tin alloy (about 37% by weight lead and about 63% by weight tin) in the form of spherical units. This material is commercially available from the Liton-Kester Co. of Chicago, IL.

Other powdered metal compositions which may be used herein include the following, all of which are available from the Litton-Kester Co.:

| METAL | WEIGHT % |
| --- | --- |
| COMPOSITION 1 | |
| Tin | 60 |
| Lead | 40 |
|  | 100% |
| COMPOSITION 2 | |
| Tin | 62 |
| Lead | 36 |
| Silver | 2 |
|  | 100% |
| COMPOSITION 3 | |
| Tin | 42 |
| Bismuth | 58 |
|  | 100% |
| COMPOSITION 4 | |
| Tin | 43 |
| Lead | 43 |
| Bismuth | 14 |
|  | 100% |
| COMPOSITION 5 | |
| Tin | 37.5 |
| Lead | 37.5 |
| Indium | 25 |
|  | 100% |

However, the present invention shall not be limited to only those compositions listed above, which may contain other metals including antimony.

After application of the powdered metal composition 30, which is applied in an amount slightly greater tan that necessary to cover the pattern 20, the excess composition 30 is removed form he pattern 20 and substrate 12. This is preferably accomplished through e use of a vibrating apparatus 36 known in the art. A vibrating apparatus 36 suitable for use in the present invention consists of a vibrating platform manufactured by the M-Rad Corporation of Woburn, MA. In a preferred embodiment, the platform is adjusted to vibrate the substrate 12 at a frequency of about 60 Hz. Other method may also be used to remove excess composition 30 from the substrate 12, including the use of a n air blower system (not shown) designed to generate air streams which displace excess composition 30 from the substrate 12.

Next, the remaining powdered metal composition 30 on the pattern 20 is melted using a heater 38. The heater 38 may consist of a conventional infra-red heating unit, convection oven or similar apparatus known in the art. The amount of heat supplied by the heater 38 must be sufficient to melt the composition 30 on the pattern 20 in a short period of time (e.g. 0.5-10 minutes.) In a preferred embodiment, the substrate 12, pattern 20, and composition 30 are heated at a temperature of about 100-250 degrees C over a time period of about 0.5-10 minutes. If the composition 30 consists of the material described above which is manufactured from a 37% lead 63% tin alloy, a preferred temperature of about 200 degrees C is applied for a time period of about 2 minutes.

The application of heat as described above effectively melts the composition 30 onto the pattern 20 and substrate 12, thereby producing a conductive trace pattern 50 (FIG. 2) substantially identical t the previously-applied pattern 20.

The substrate 12 with the completed trace pattern 50 thereon is then cut as desired using a outer 60 known in the art to produce individual circuit units 70 suitable for use in a wide variety of applications. In addition, any residual substrate 12 is preferably fed onto a collection roll 80, as illustrated in FIG. 1.

The present invention represents a highly efficient method of applying metal trace patterns to a substrate. It is especially suitable for use in highspeed, mass production manufacturing facilities. In addition, the use of an ink jet system to apply an initial pattern to the substrate enables the pattern to be applied in a highly precise and controlled manner.

Accordingly, it is anticipated that suitable modifications may be made to the invention by individuals skilled in the art which are entirely within the scope of the invention. For example, the chemicals used to prepare the ink, as well the materials used in the powdered metal composition may be selectively varied. Thus, the present invention shall only be construed in accordance with the following claims:

We claim:

1. A method for applying conductive traces to a substrate comprising:
   providing a substrate;
   providing a supply of ink comprising about 5-40% by weight adhesive therein;
   supplying said ink to a thermal ink jet printing apparatus;
   activating said apparatus in order to deliver said ink to said substrate in a pattern;
   providing a metal alloy powder which will melt at a temperature of about 100-250 degrees C;
   applying said metal alloy powder onto said pattern in an amount sufficient to cover said pattern, said metal alloy powder adhering to said adhesive in said ink;
   removing any excess amounts of said metal alloy powder from said pattern; and
   heating said substrate with said pattern and said metal aloy powder thereon at a temperature of about 100-250 degrees C so as to melt sad metal alloy powder directly onto said pattern in order to form a metal layer on top of said pattern from the melted metal aloy powder, thereby creating an arrangement of conductive traces on said substrate identical with said pattern.

2. The method of claim 1 wherein said substrate comprises a material selected from eh group consisting of polyester, acrylonitrile-butadiene-styrene plastic, polyvinyl chloride plastic, polycarbonate plastic, and mixtures thereof.

3. The method of claim 1 wherein said substrate with said pattern and said metal alloy powder thereon is heated at said temperature for about 0.5-10 minutes.

4. The method of claim 1 wherein said removing of said excess amounts of said metal alloy powder comprises agitating said substrate with said pattern and said metal alloy powder thereon in an amount sufficient to displace said excess amounts of said metal alloy powder from said substrate.

5. The method of claim 1 wherein said ink has a viscosity of about 5-25 cps and a surface tension of about 30-60 dynes/cm.

6. A method for applying conductive traces to a substrate comprising:
   providing a substrate;
   providing a supply of ink comprising about 5-40% by weight adhesive therein, said ink having a viscosity of about 5-25 cps and a surface tension of about 30-60 dynes/cm;
   supplying said ink to a thermal ink jet printing apparatus;
   activating said apparatus in order to deliver said ink to said substrate in a pattern;
   providing a metal alloy power having a melting point of about 100-250 degrees C;
   applying said metal alloy power onto said pattern in an amount sufficient to cover said pattern, said metal alloy powder adhering to said adhesive in said ink;
   agitation said substrate with said pattern and said metal alloy powder thereon in an amount sufficient to displace any excess amounts of said metal alloy powder from said pattern; and
   heating said substrate with said pattern and said metal alloy powder thereon at a temperature of about 100-250 degrees C for about 0.5-10 minutes so as to melt said metal alloy powder directly onto said pattern in order to form a metal layer on top of said pattern from the melted metal alloy powder, thereby creating an arrangement of conductive traces on said substrate identical with said pattern.

* * * * *